United States Patent [19]

Fujishima

[11] Patent Number: 4,789,976

[45] Date of Patent: Dec. 6, 1988

[54] TEMPERATURE COMPENSATION CIRCUIT FOR A DELAY CIRCUIT UTILIZED IN AN FM DETECTOR

[75] Inventor: Masakazu Fujishima, Hamamatsu, Japan

[73] Assignee: Nippon Gakki Seizo Kabushiki Kaisha, Hamamatsu, Japan

[21] Appl. No.: 30,159

[22] Filed: Mar. 25, 1987

[30] Foreign Application Priority Data

Mar. 31, 1986 [JP] Japan .............................. 61-47499[U]

[51] Int. Cl.⁴ .......................... H03K 7/14; G11B 7/00
[52] U.S. Cl. ...................................... 369/54; 358/330; 357/28; 357/41; 307/310; 307/450; 307/451; 307/579; 329/110
[58] Field of Search ............... 358/337, 338, 320, 321, 358/330; 369/54; 357/28, 41, 51; 307/310, 450, 451, 579; 329/110, 107, 126, 134

[56] References Cited

U.S. PATENT DOCUMENTS 4,614,912  9/1986  Moberg ............................... 329/110
4,717,836  1/1988  Doyle ............................... 357/51 X Primary Examiner—Robert L. Richardson
Attorney, Agent, or Firm—Spensley Horn Jubas & Lubitz

[57] ABSTRACT

A circuit for compensating change in delay time of a delay circuit due to variation in temperature employs, as a phase shifter of a pulse FM detection circuit, a delay circuit whose delay time is subject to change due to variation in temperature and can be controlled in response to a control signal. A dc component in an output of this pulse FM detection circuit is compared with a preset reference value and a resulting comparison output is used for controlling the delay time of the delay circuit and thereby compensating the temperature characteristic of the delay time. In a device using plural delay circuits, these delay circuits can be disposed on the same substrate and the delay times of these delay circuits can be controlled by the same comparison output. Since a signal which is handled by a delay circuit is utilized for the temperature compensation, an accurate temperature compensation can be realized with a simple circuit construction.

5 Claims, 5 Drawing Sheets

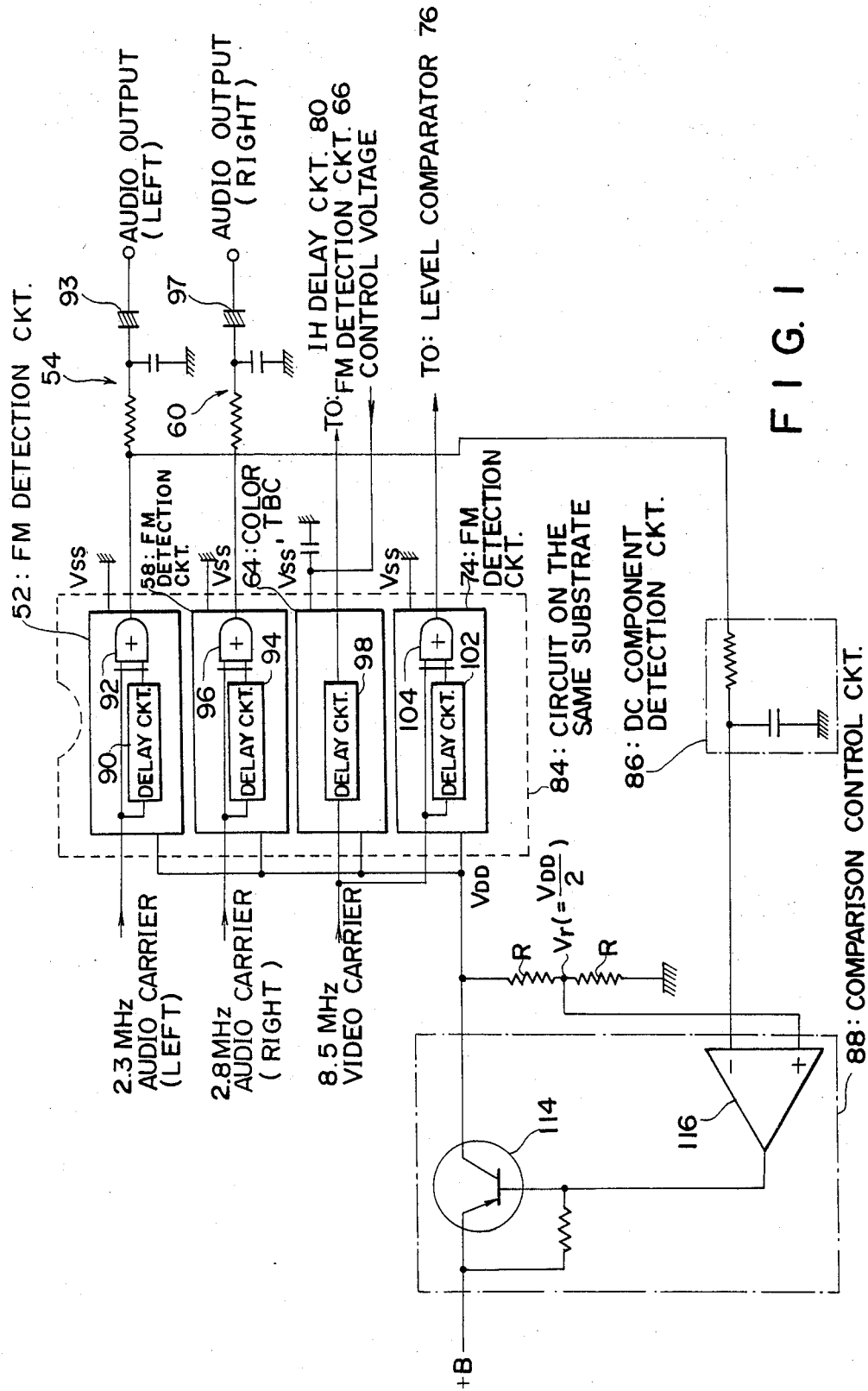
F I G. 1

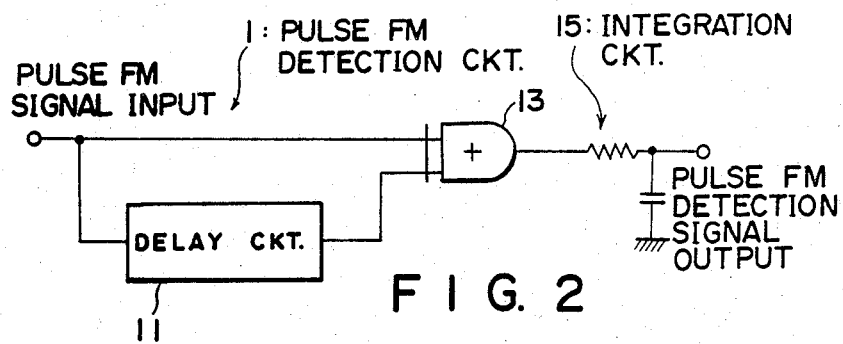
F I G. 2
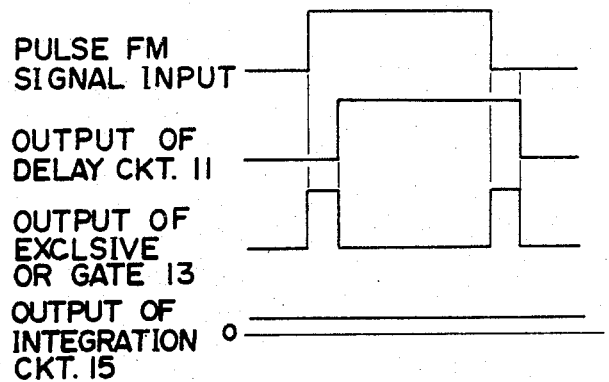
F I G. 3
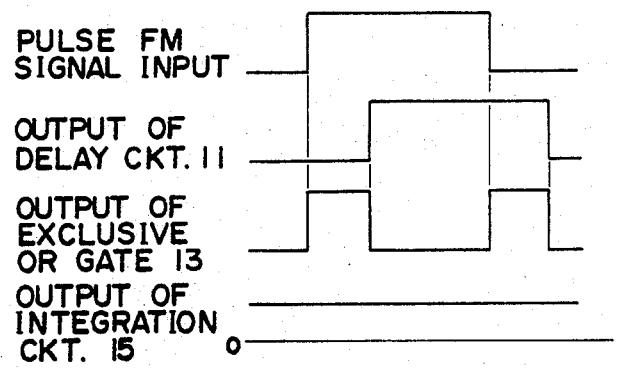
F I G. 4

TEMPERATURE COMPENSATION CIRCUIT FOR A DELAY CIRCUIT UTILIZED IN AN FM DETECTOR

BACKGROUND OF THE INVENTION

This invention relates to a circuit for compensating variation in delay time of a delay circuit due to temperature change. The circuit realizes a simplified circuit design by utilizing a signal treated in the delay circuit for an compensating operation.

A delay circuit is used in, for example, a video disc playback device for pulse-FM-detection of a video signal or an audio signal. In a pulse-FM-detection circuit 1, as shown in FIG. 2, a pulse frequency-modulated signal and a signal derived by delaying this signal for a predetermined period of time by a delay circuit 11 are applied to an exclusive OR gate 13 and an output of the exclusive OR gate 13 is integrated by an integration circuit 15. FIG. 3 shows the operation of this pulse-FM-detection circuit 1.

For the delay circuit 11, a circuit which utilizes a signal delaying characteristic of a gate circuit of a CMOS inverter, for example, may be used. The CMOS inverter is a circuit in which, as shown in FIG. 5, gates and drains of a p-channel MOS-FET 12 and an n-channel MOS-FET 14 are respectively connected to each other and power voltages $V_{DD}$ and $V_{SS}$ are applied to the sources of these MOS-FETs 12 and 14. In the CMOS inverter 10, a signal is applied to the gate through an input terminal 16 and an inverted signal of the input signal is provided from the drain to an output terminal 18.

In this CMOS inverter 10, a delay time is produced between the input and output. This delay time depends, as shown in FIG. 6, upon the power voltage $V_{DD}-V_{SS}$, namely the smaller the power voltage $V_{DD}-V_{SS}$, the longer is the delay time and the larger is the rate of change of the delay time. This is due to the fact that conductance of the circuit elements is caused to change by the power voltage $V_{DD}-V_{SS}$.

Delay time of about 3 ns to 5 ns is obtained per each CMOS inverter 10 so that a longer delay time can be obtained by cascade-connecting plural CMOS inverters 10.

As shown in FIG. 6, the delay time of the CMOS inverter 10 is subject to variation due to change in the ambient temperature. If there is variation in the delay time due to the temperature, accuracy of the pulse FM detection is deteriorated.

For improving such delay time-temperature characteristic of the delay circuit utilizing a CMOS inverter, efforts have been made for improving the temperature characteristic of the component elements of the CMOS inverter itself.

An alternative proposal for improving the delay time-temperature characteristic is made in Japanese Patent application No. 160785/1984 (Preliminary Publication No. 39722/1986). The circuit disclosed in this application is shown in FIG. 7. In this circuit, a ring oscillator 20 utilizes the delay characteristic of the CMOS inverter shown in FIG. 5 and is constructed of CMOS inverters of an odd number 22, 24 and 26 connected in cascade-connection with an output of the final stage CMOS inverter 26 being applied to the initial stage CMOS inverter 22. The oscillation frequency of the ring oscillator 20 is determined by the delay time of its open loop. The oscillation output of the ring oscillator 20 is waveshaped by a CMOS inverter 28 and thereafter is applied to a comparator 30. The comparator 30 compares, in frequency and phase, this signal with a reference frequency singal obtained by frequency-dividing an output pulse of a quartz oscillator 32 by a frequency divider 34 and thereupon produces a signal of a pulse width corresponding to difference between the two signals compared with each other.

A control voltage generation circuit 36 generates dc voltages $V_{DD}$ and $V_{SS}$ by smoothing the output pulse of the comparator 30. These dc voltages $V_{DD}$ and $V_{SS}$ are applied to the CMOS inverters 22, 24 and 26 constituting the ring oscillator 20. Since the delay characteristics of the CMOS inverters 22, 24 and 26 depend upon voltage applied thereto as described above, a highly stable oscillation frequency (with accuracy of the reference frequency) can be obtained from the ring oscillator 20 by contructing a PLL (phase-locked loop) by forming the above described loop as a negative feedback loop. That is, the delay time of the respective CMOS inverters 22, 24 and 26 are controlled to a constant delay time. By disposing the pulse FM detection circuit 1 shown in FIG. 2 in the same environment as the inverters 22, 24 and 26 (e.g., the same substrate of an integrated circuit) and applying the control voltages $V_{DD}$ and $V_{SS}$ obtained by the control voltage generation circuit 36 to the pulse FM detection circuit 1, variation in the delay time due to temperature change in this pulse FM detection circuit 1 can be eliminated.

The FM detection circuit of FIG. 2, the delay circuit of FIG. 5 and the temperature compensation circuit for a delay circuit shown in FIG. 7 are respectively disclosed in the specification of the U.S. patent application Ser. No. 760,332 filed July 29, 1985.

In the prior art temperature compensation circuit in which the temperature compensation is realized by improving the temperature characteristics of the component elements of the CMOS inverter itself, extra labor and cost are incurred for selection of material of the component elements of the CMOS inverter and processing of the material for imparting necessary characteristics to it and, besides, it has been found that the improvement achieved is of a limited degree.

The prior art circuit shown in FIG. 7 is meritorious in that it performs an active compensation by utilizing the electrical loop which can realize a temperature compensation which is constantly accurate regardless of characteristics of the component elements. This curcuit, however, additionally requires the ring oscillator 20 and the quartz oscillator 32 so that this circuit has the disadvantage that the circuit design becomes very complicated and costly.

It is, therefore, an object of the invention to provide a temperature compensation circuit for a delay circuit capable of realizing an active temperature compensation using an electric loop with a simplified circuit construction.

SUMMARY OF THE INVENTION

According to the invention, the above described object of the invention is achieved by a circuit in which a dc component in an output of a pulse FM detection circuit is compared with a preset reference value and a result of this comparison is used for controlling the delay time of a delay circuit in the pulse FM detection circuit thereby to compensate the delay time-temperature characteristic of this delay circuit.

The temperature compensation circuit according to the invention is characterized in that it comprises a delay circuit which is used as a phase-shifter in a pulse FM detection circuit and whose delay time changes depending upon temperature and can be controlled in response to a control signal, a dc component detection circuit for detecting a dc component in an output of the pulse FM detection circuit, and comparison control means for comparing the dc component detected by the dc component detection circuit with a predetermined reference value for controlling delay time of the delay circuit with a comparison output of this comparison control means and thereby compensating a temperature characteristic of the delay time of the delay circuit.

In the pulse FM detection circuit, the dc component of the detection output is determined by voltage level, frequency and delay time of a pulse signal before integration (i.e., the output pulse signal of the exclusive OR gate 13 of FIG. 2). Since the frequency is equal to the carrier frequency of the input pulse FM signal if the frequency is timewise averaged and therefore it is constant, the output dc component is determined by the delay time, assuming that the voltage level of the pulse signal before the integration is constant. Accordingly, by controlling the delay time of the delay circuit of the pulse FM detection circuit so that this dc component becomes constant, the delay time-temperature characteristic of this delay circuit can be compensated and an accurate pulse FM detection thereby can be realized. Since this temperature compensation is an active compensation using the electric loop, a constantly accurate temperature compensation can be realized regardless of characteristics of variation of the component elements (delay elements). Besises, since this temperature compensation can be achieved by using a signal which is the same signal that is handled in the delay circuit, the circuit can be realized with a simple circuit construction.

In a device using plural delay circuits, these delay circuits can be placed under the same temperature condition if these circuits are disposed on the same substrate and, accordingly, a control signal used for temperature compensation of the delay circuit in the pulse FM detection circuit may be concurrently used for temperature compensation of the other delay circuits. This obviates provision of separate temperature compensation circuits for these other delay circuits so that the circuit construction can be further simplified.

BRIEF DESCRIPTION OF THE DRAWINGS

In the accompanying drawings,

FIG. 1 is a circuit diagram showing a specific example of a portion of a circuit of FIG. 8 which shows an embodiment of the invention;

FIG. 2 is a circuit diagram showing a pulse FM detection circuit;

FIG. 3 is a waveshape diagram showing the operation of the circuit of FIG. 2;

FIG. 4 is a waveshape diagram showing the operation of the circuit of FIG. 2 when the delay time is changed;

DESCRIPTION OF A PREFERRED EMBODIMENT

Figure 8:
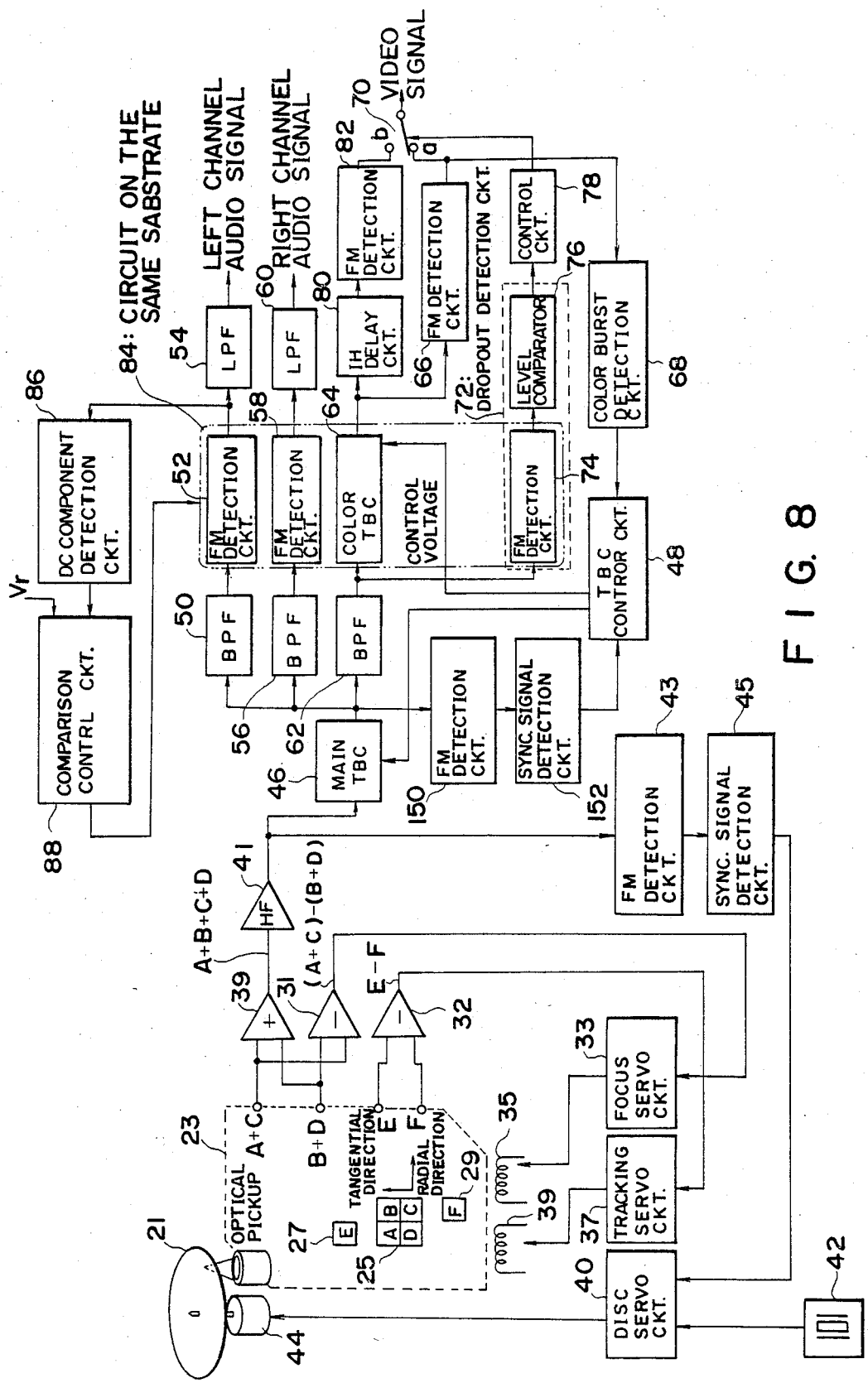
FIG. 8 is a block diagram showing an embodiment of the invention in which the invention has been applied to a video disc playback device.

Referring to FIG. 8, an embodiment of the invention in which the invention has been applied to a video disc playback device will be described.

A signal recorded on a disc 21 is read by an optical pickup 23. The optical pickup 23 receives laser beam reflected from the disc 21 by means of a four-split photodiode 25 and a tracking photodiodes 27 and 29. The four-split photodiode 25 adds detection outputs on diagonals of four detection outputs A, B, C, and D together and outputs signals A+C and B+D. The tracking photodiodes 27 and 29 produce signals E and F.

The signals A+C and B+D are subject to subtraction by a subtractor 31 to detect a focus error. A focus servo circuit 33 drives a focus coil 35 so as to reduce the focus error to zero.

The signals E and F are subject to subtraction by a subtractor 32 to detect a tracking error. A tracking servo circuit 37 drives a tracking coil 39 so as to reduce the tracking error to zero.

The signals A+C and B+D are added together by an adder 39. The sum signal A+B+C+D through an HF (High Frequency) amplifyier 41 is FM-detected by an FM detection circuit 43 and thereafter is applied to a synchronizing signal detection circuit 45 for detecting a horizontal synchronizing signal contained in the sum signal. A disc servo circuit 40 compares the detected horizontal synchronizing signal with a reference clock from a reference signal generator 42 in frequency and phase and controls the rotation speed of a disc motor 44 so that the two signals coincide with each other.

A main TBC 46 removes a jitter contained in a reproduced signal from the disc and is constructed of a delay circuit capable of continuously varying delay time for delaying a binary signal. As such delay circuit, one utilizing the signal delay characteristic of a CMOS gate, for example, may be employed. A TBC control circuit 48 compares, in phase, a horizontal synchronizing signal detected by passing the output signal of the main TBC 46 through an FM detection circuit 150 and a synchronizing signal detection circuit 152 with a reference clock corresponding to a normal horizontal synchronizing signal and controls the delay time of the main TBC 46 in accordance with a phase error detected for absorbing jitter.

The output signal of the main TBC 46 is applied through a band-pass filter 50, an FM detection circuit 52 and a low-pass filter 54 and a left channel audio signal thereby is provided. Likewise, the output signal of the main TBC 46 is applied through a band-pass filter 56, an FM detection circuit 58 and a low-pass filter 60 and a right channel audio signal thereby is provided.

The output signal of the main TBC 46 is also applied to a color TBC 64 through a band-pass filter 62. The color TBC 64 is a circuit for absorbing minute jitter which cannot be absorbed completely by the main TBC 46. The color TBC 64 is constructed of, for example, a delay circuit capable of continuously varying delay time in the same manner as in the main TBC 46. The TBC control circuit 48 compares, in phase, a color burst derived by passing the output signal of the color TBC 64 through an FM detection circuit 66 and a color burst detection circuit 68 with a reference clock of 3.58 MHz corresponding to a normal subcarrier and controls the delay time of the color TBC 64 in accordance with the phase error between these signals for absorbing minute jitter in the reproduced signal.

The output signal of the color TBC 64 is FM-detected by the FM detection circuit 66 and is provided as a video signal through a terminal a of a switch 70.

A dropout detection circuit 72 is provided for detecting a dropout in the reproduced signal. In the dropout detection circuit 72, the output of the band-pass filter 62 is FM-detected by an FM detection circuit 74 and thereafter is compared in its level by a level comparator (window comparator) 76. If there is a dropout in the reproduced signal from the disc, a noise of a large level is produced when the video FM signal is FM-detected. Accordingly, by comparing the output of the FM detection circuit 74 with upper and lower detection levels suitably set in the level comparator 76, the dropout can be detected.

When the dropout has been detected, a control circuit 78 causes the switch 70 to be connected to a terminal b during 1H (horizontal scanning period). Since a signal derived by delaying the output signal of the color TBC 64 by 1H by a 1H delay circuit 80 and FM-detecting it by an FM detection circuit 82 is supplied to the terminal b side, a signal whose 1H section in which the dropout has occurred has been interpolated by an immediately preceding 1H section is provided from the switch 70 whereby correction of the dropout can be accomplished.

In the embodiment shown in FIG. 8, as shown by a chain-and-dot line 84, the FM detection circuits 52, 58 and 74 and the color TBC 64 are constructed on the same substrate (e.g., a substrate of an integrated circuit). Compensation of temperature in this delay circuit is effected by detecting dc component in the output of the FM detection circuit 52 by a dc component detection circuit 86, comparing the detected dc component with a reference voltage Vr by a comparison control circuit 88 and controlling the delay time of the delay circuit in the FM detection circuit 52 with the output of the comparison control circuit 88. Delay times of the respective delay circuits in the other circuits, i.e., the FM detection circuits 58 and 74 and the color TBC 64 are also controlled by the comparison output of the comparison control circuit 88. Since these FM detection circuits 58 and 74 and the color TBC 64 are under the same temperature condition as the FM detection circuit 52, the temperature compensation can be likewise performed with respect to these circuits 58, 74 and 64 by utilizing the temperature compensation control signal for the FM detection circuit 52.

A specific example of the circuit 84, the dc component detection circuit 86 and the comparison control circuit 88 which are constructed on the same substrate in FIG. 8 is shown in FIG. 1.

In the FM detection circuit 52, a left channel audio carrier of 2.3 MHz and a signal derived by delaying this signal by a delay circuit 90 are applied to an exclusive OR gate 92. The output pulse of the exclusive OR gate 92 is integrated by an integration circuit 54 and the output of the integration circuit 54 is provided as a left channel audio signal after having its dc component removed by a capacitor 93. In the FM detection circuit 58, a right channel audio carrier of 2.8 MHz and a signal derived by delaying this signal by a delay circuit 94 are applied to an exclusive OR gate 96. The output pulse of the exclusive OR gate 96 is integrated by an integration circuit 60 and the output of the integration circuit 60 is provided as a right channel audio signal after having its dc component removed by a capacitor 97. In the color TBC 64, a video carrier of 8.5 MHz is applied to a delay circuit 98. In the FM detection circuit 74, a video carrier of 8.5 MHz and a signal derived by delaying this signal by a delay circuit 102 are applied to an exclusive OR gate 104.

Figure 5:
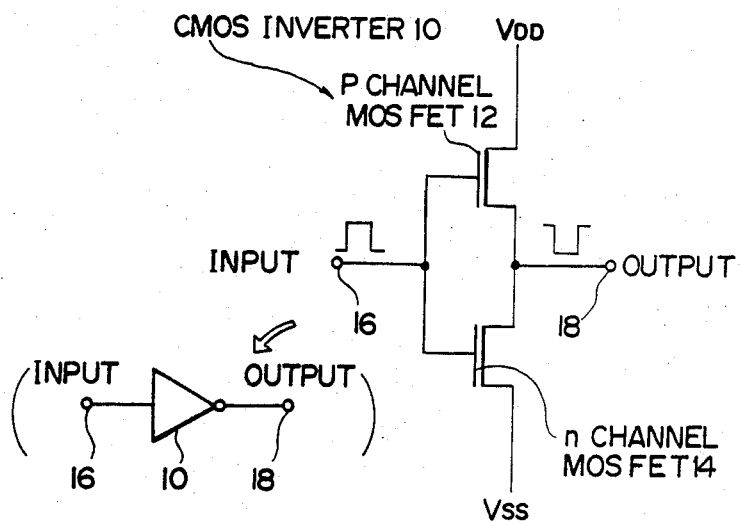
FIG. 5 is a circuit diagram of a CMOS inverter 10.
Figure 6:
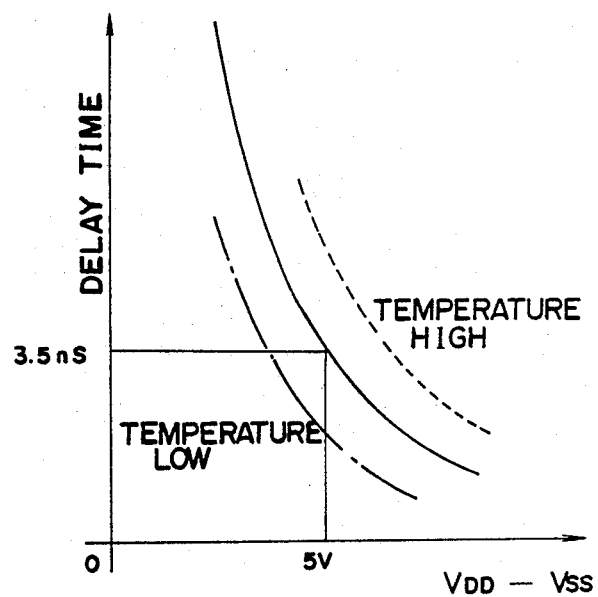
FIG. 6 is a characteristic diagram of the circuit of FIG. 5.
Figure 7:
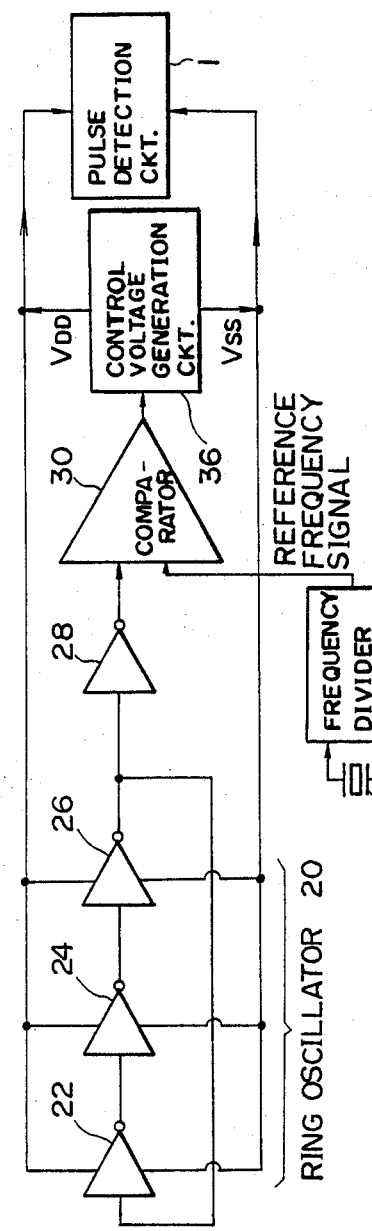
FIG. 7 is a block diagram showing a prior art temperature compensation circuit for a delay circuit.
Figure 9:
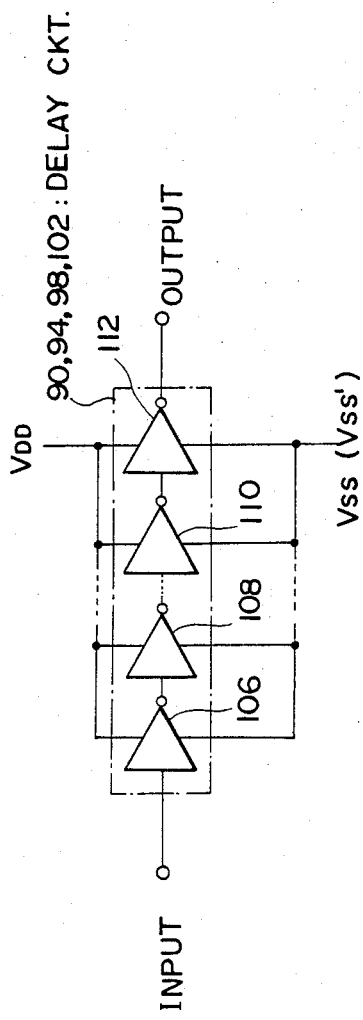
FIG. 9 is a circuit diagram showing an example of construction of delay circuits 90, 94, 98 and 102 in FIG. 1.

The delay circuits 90, 94, 98 and 102 of these FM detection circuits 52, 58 and 74 and the color TBC 64 are respectively constructed by cascade-connecting CMOS inverters 106, 108, ..., 110 and 112 in about 500 stages, as shown in FIG. 9. Power voltages $V_{DD}$ and $V_{SS}$ are applied to the delay circuits 90, 94 and 102 of the FM detection circuits 52, 58 and 74. The voltage $V_{DD}$ is produced by controlling dc voltage +B by a transistor 114. The voltage $V_{SS}$ is the ground level. Power voltages $V_{DD}$ and $V_{SS'}$ are applied to the delay circuit 98 of the color TBC 64. The power voltage $V_{SS'}$ represents the value of a control voltage for controlling the delay time of the delay circuit 98 for absorbing jitter in the reproduced video signal.

A dc component detection circuit 86 integrates the output of the FM detection circuit 52 for the left channel audio signal (having, for this purpose, a sufficiently larger time constant than the integration circuit 54) and detects a dc component in this output signal. Using a voltage $V_{DD}/2$ obtained by voltage-dividing the voltage $V_{DD}$ with resistors R, R (having same resistance values) as a reference voltage Vr, a comparison control circuit 88 detects difference between this reference voltage Vr and the output dc voltage of the dc component detection circuit 86 by means of an operational amplifier 116 and applies the detected difference voltage to the base of a control transistor 114 for controlling the value of the voltage $V_{DD}$.

According to the circuit of FIG. 1, as the delay time of the delay circuit 90 becomes shorter with the rise of temperature, the pulse width of the output pulse of the FM detection circuit 52 generally is decreased so that the level of the dc component also is decreased. An input to an inverting input terminal of the operational amplifier 116 thereby is decreased with a result that its output is increased. This in turn causes the base current of the control transistor 114 to be decreased with resulting decrease in the value of the voltage $V_{DD}$. Consequently, the delay time is changed in such a manner that it becomes generally longer. Since the other delay circuits 94, 98 and 102 are placed under the same temperature condition as the delay circuit 90, the delay time of these circuits is controlled in the same manner by employing the above described controlled voltage $V_{DD}$.

As the delay time of the delay circuit 90 becomes longer with the fall of temperature, the pulse width of the output pulse of the FM detection circuit 52 generally is increased so that the level of the dc component also is increased. An input to the inverting input terminal of the operational amplifier 116 thereby is increased with a result that its output is decreased. This in turn causes the base current of the control transistor 114 to be increased with resulting decrease in the value of the voltage $V_{DD}$. Consequently, the delay time is changed in such a manner that it generally becomes shorter. Since the other delay circuits 94, 98 and 102 are placed under the same temperature condition as the delay circuit 90, the delay time of these circuits is controlled in the same manner by employing the controlled voltage $V_{DD}$.

In the foregoing manner, the output dc component of the FM detection circuit 52 is fixed to $V_{DD}/2$ so that the delay time of the delay circuit 90 is fixed to a certain length of time regardless of variation in the temperature. This enables the other delay circuits 94, 102 and 98 of the FM detection circuit 58 and 74 and the color TBC 64 to be also compensated against variation in the temperature and, accordingly, an accurate operation of the delay circuits is ensured.

In the above described embodiment, the dc output of the audio signal FM detection circuit 52 is fixed to $V_{DD}/2$ because FM detection is based on duty factor 50% and therefore the detection characteristic can be established at the most efficient point.

In the embodiment of FIG. 1, the reference voltage Vr is produced by voltage-dividing the voltage $V_{DD}$ after the control. Alternatively, the reference voltage Vr may be produced by voltage-dividing the voltage +B before the control.

In this embodiment, the delay circuits are constructed of CMOS inverters. The invention, however, is applicable to delay circuits of other types in which the delay time can be controlled by a control signal and the delay time is subject to change due to variation in temperature.

What is claimed is:

1. A temperature compensation circuit for a delay circuit comprising:
   a delay circuit which is used as a phase-shifter in a pulse FM detection circuit and whose delay time changes depending upon temperature and can be controlled in response to a control signal;
   a dc component detection circuit for detecting a dc component in an output of said pulse FM detection circuit; and
   comparison control means for comparing the dc component detected by said dc component detection circuit with a predetermined reference value for controlling delay time of said delay circuit with a comparison output of the comparison control means and thereby compensating a temperature characteristic of the delay time of said delay circuit.

2. A temperature compensation circuit as defined in claim 1 wherein said delay circuit is constructed of cascade-connected CMOS inverters.

3. A temperature compensation circuit as defined in claim 2 wherein said comparison control means controls power voltage supplied to said CMOS inverters of said delay circuit with said comparison output for controlling the delay time.

4. A temperature compensation circuit as defined in claim 3 wherein said pulse FM detection circuit comprises an exclusive OR gate to which a pulse frequency-modulated signal and a signal derived by delaying this pulse frequency-modulated signal by said delay circuit are applied.

5. A temperature compensation circuit as defined in claim 1 wherein said delay circuit and other delay circuits whose delay time changes depending upon temperature and can be controlled in response to a control signal are disposed on the same substrate and the delay times of these other delay circuits are controlled by said comparison output to compensate temperature characteristics of the delay times of said other delay circuits.

* * * * *